United States Patent [19]
Smayling

[11] Patent Number: 5,942,374
[45] Date of Patent: Aug. 24, 1999

[54] INTEGRATED CIRCUITS FORMED IN RADIATION SENSITIVE MATERIAL AND METHOD OF FORMING SAME

[75] Inventor: Michael C. Smayling, Missouri City, Tex.

[73] Assignee: Texas Instruments Incorporated, Dallas, Tex.

[21] Appl. No.: 08/871,026

[22] Filed: Jun. 6, 1997

Related U.S. Application Data

[62] Division of application No. 08/479,281, Jun. 7, 1995, abandoned.

[51] Int. Cl.$^6$ .................................................. G03F 7/00
[52] U.S. Cl. ..................... 430/312; 430/313; 430/296; 430/394; 250/492.2; 438/514
[58] Field of Search .................................... 430/311, 312, 430/313, 314, 327, 328, 330, 296, 394; 250/492.2, 492.21, 492.22, 492.23, 492.3; 438/510, 514

[56] References Cited

U.S. PATENT DOCUMENTS

| | | | |
|---|---|---|---|
| 3,816,163 | 6/1974 | Yoldas | 117/46 FA |
| 4,098,654 | 7/1978 | Helle et al. | 204/16 |
| 4,222,903 | 9/1980 | Heeger et al. | 252/518 |
| 4,257,825 | 3/1981 | Schaumburg | 148/1.5 |
| 4,440,841 | 4/1984 | Tabuchi | 430/5 |
| 4,702,792 | 10/1987 | Chow et al. | 156/628 |
| 4,707,394 | 11/1987 | Chant | 428/209 |
| 4,733,383 | 3/1988 | Waterbury | 368/10 |
| 4,772,421 | 9/1988 | Ikenaga et al. | 252/500 |
| 4,772,804 | 9/1988 | Grimaud et al. | 307/10 LS |
| 4,781,971 | 11/1988 | Marikar et al. | 428/212 |
| 4,835,118 | 5/1989 | Jones, Jr. et al. | 437/173 |
| 4,839,219 | 6/1989 | Uekita et al. | 428/220 |
| 4,843,034 | 6/1989 | Herndon et al. | 437/189 |
| 4,843,443 | 6/1989 | Ovshinsky et al. | 357/23.7 |
| 4,853,277 | 8/1989 | Chant | 428/209 |
| 4,863,833 | 9/1989 | Fukuyama et al. | 430/286 |
| 4,906,966 | 3/1990 | Imamura et al. | 338/195 |

(List continued on next page.)

FOREIGN PATENT DOCUMENTS

| | | |
|---|---|---|
| 0 233 023 | 8/1987 | European Pat. Off. . |
| 0 383 584 | 8/1990 | European Pat. Off. . |
| 0 478 368 | 4/1992 | European Pat. Off. . |
| 1-37872 | 2/1989 | Japan . |
| 1-207975 | 8/1989 | Japan . |
| 2-184072 | 7/1990 | Japan . |
| WO 92/16023 | 9/1992 | WIPO . |
| WO 92/20072 | 11/1992 | WIPO . |

OTHER PUBLICATIONS

"A Wafer–Scale Digital Integrator Using Restructurable VSLI", Raffel et al., *IEEE Transactions on Electron Devices*, vol. ED–32, No. 2, Feb. 1985, pp. 479–486.

"Arsenic Trifluoride–Arsenic Pentafluoride Snyergism in the Formation of Electrically Conductive Poly(p–Phenylene Sulfide)", Fromer, et al., *Journal of Polymer Science*, Polymer Letters Edition, vol. 21, No. 1, Jan. 1983, pp. 39–44.

(List continued on next page.)

*Primary Examiner*—Kathleen Duda
*Attorney, Agent, or Firm*—Robby T. Holland; Carlton H. Hoel; Richard L. Donaldson

[57] ABSTRACT

A transistor device 10 is disclosed herein. A doped layer 14 of a radiation sensitive material is formed over a substrate 12. The radiation sensitive material 14 may be polyimide, polybenzimidazole, a polymer, an organic dielectrics, a conductor or a semiconductor and the substrate 12 may be silicon, quartz, gallium arsenide, glass, ceramic, metal or polyimide. A neutral (undoped) layer 16 of radiation sensitive material is formed over the doped layer 14. First and second source/drain regions 18 and 20 are formed in the neutral layer 16 and extend to a top portion of the doped layer 14. A gate region 22 is formed in a top portion of the neutral layer 16 between the first source/drain region 18 and second source/drain region 20 such that a channel region 24 is formed in the doped layer 14 beneath the gate region 22.

32 Claims, 10 Drawing Sheets

U.S. PATENT DOCUMENTS

| | | | |
|---|---|---|---|
| 4,935,164 | 6/1990 | Wessling et al. | 252/500 |
| 5,017,420 | 5/1991 | Marikar et al. | 428/212 |
| 5,028,354 | 7/1991 | Smith et al. | 252/500 |
| 5,100,762 | 3/1992 | Tanaka et al. | 430/270 |
| 5,101,253 | 3/1992 | Mizutani et al. | 357/30 |
| 5,119,312 | 6/1992 | Gröger et al. | 364/483 |
| 5,130,380 | 7/1992 | Carew | 525/343 |
| 5,272,024 | 12/1993 | Lin | 430/5 |
| 5,376,502 | 12/1994 | Novak et al. | 430/270 |
| 5,493,129 | 2/1996 | Matsuzaki et al. | 257/61 |
| 5,567,550 | 10/1996 | Smayling | 430/5 |

OTHER PUBLICATIONS

"BJT Transistor Circuit Configurations", Professional Publications, Inc., *Circuits Electronics*, p. 51–7.

"Cocyclotrimerization of Aryl Acetylenes: Substituent Effects on Reaction Rate", Dawson et al., *American Chemical Society, Polymers for High Technology*, Chapter 38, 1987, pp. 445–456.

"Complex Triarylsulfonium Salt Photoinitiators. I. The Identification, Characterization, and Syntheses of a New Class of Triarylsulfonium Salt Photoinitiators", Crivello, *Polymer Chemistry Edition*, vol. 18, No. 8, Aug. 1980, pp. 2677–2695.

"Conducting complexes of polyphenylene sulfides", Shacklette et al., *The Journal of Chemical Physics*, vol. 75, No. 4, Aug. 15, 1981, pp. 1919–1927.

"Electronic Circuits Made Quick 'n' Easy", Amal Kumar Naj, Lab Notes, *Wall Street Journal*, Aug. 29, 1990, 1 sheet.

"Excimer Lasers", Rhodes, *Topics in Applied Physics*, Second Enlarged Edition, Chapter 4, 1984, pp. 87–137.

"High–Aspect–Ratio Via–Hole Filling with Aluminum Melting by Excimer Laser Irradiation for Multilevel Interconnection", Mukai et al., *IEEE Electron Device Letters*, vol. EDL–8, No. 2, Feb. 1987, pp. 76–78.

"Ion beam irradiated via–connect through an insulating polymer layer", Venkatesan et al., *Journal of Applied Physics*, vol. 55, No. 4, American Institute of Physics, Feb. 1984, pp. 1212–1214.

"Laser–formed connections using polyimide", Raffel et al., *Applied Phys. Lett.* vol. 42, No. 8, American Institute of Physics, Apr. 1983, pp. 705–706.

"Low Pressure Chemical Vapor Deposition of Tungsten and Aluminum for VLSI applications", Levy et al., *Journal of the Electrochemical Society, Reviews and News*, Feb. 1987, pp. 37C–49C.

"Material and Processing Technologies of Polyimide for Advanced Logic Double Metal Devices", Moghadam, 1st International SAMPE Electronics Conference, Jun. 23–25, 1987, pp. 622–636.

"Multilayer Interconnections Using Polyimide Dielectrics and Aluminum Conductors", Tsunetsugu et al., *The International Journal for Hybrid Microelectronics*, vol. 8, No. 2, Jun. 1985, pp. 21–26.

"Nondestructive single–shot soft x–ray lithography and contact microscopy using a laser–produced plasma source", Rosser et al., *Optical Society of America, Applied Optics*, Oct. 1987, vol. 26, No. 19, pp. 4313–4318.

"Optical and electrical properties of ion–beam–irradiated films of organic molecular solids and polymers", Kaplan et al., *Journal of Applied Physics*, vol. 55, No. 3, Feb. 1984, pp. 732–742.

"Phllips Cooking Up Full Menu", Detar, *Electronic News*, vol. 41, No. 2071, Jun. 1995, 2 Sheets.

"Planar Multilevel Interconnection Technology Employing a Polyimide", Mukai et al., *IEEE Journal of Solid–State Circuits*, vol. SC–13, No. 4, Aug. 1978, pp. 462–467.

"Pyralin LX Polyimide Coatings Third Generation Polyimides", *DuPont Electronics*, DuPont Co., May 1988, 6 Pgs. front/back.

"Polyimides as Interlayer Dielectrics for High–Performance Interconnections of Integrated Circuits", Jensen, American Chemical Society, *Polymers for High Technology*, Chapter 40, 1987, pp. 466–483.

"Polyimides in Microelectronics", Senturia, American Chemical Society, *Polymers for High Technology*, Chapter 36, 1987, pp. 428–436.

"Polymer Device Cited as Possible LED Institute", Amal Kumar Naj, *Wall Street Journal*, 1992, 1 sheet.

"Polymer Processing to Thin Films for Microelectronic Applications", Jenekhe, *American Chemical Society*, 1987, pp. 261–269.

"Polymers in Photonic Applications and Developments", Meredith, ACS Symposium Series 346, *Polymers for High Technology*, Sep. 7–12, 1986, pp. 369–371.

"Preparation of Polyimide Mono– and Multilayer Films", Kakimoto et al., *American Chemical Society*, Chapter 41, 1987, pp. 484–495.

"New Polyimide Chemistry Matches Coefficient of Expansion of Silicon and Alumina Substrates", DuPont Corporation, *Pyralin LX Polymide Coatings*, Apr. 1989, 9 pgs.

"Plastic chips are here", *Electronic and Wireless World*, Research Notes, Dec. 1988, p. 1241.

"Quick–change plastic may make for cheaper chips", Beard, *New Scientist*, Sep. 1990, p. 36.

"Radiation–induced electrical conductivity of poly=(naphthoylenebenzimidazole)", Tyutnev et al., *Chemical Abstracts*, vol. 103, 1985, p. 24.

"Soluble Aromatic Polyimides for Film and Coating Applications", Clair et al., *American Chemical Society,, Polymers for High Technology*, Chapter 37, 1987, pp. 437–444.

"*The MOS Field–Effect Transistor*", Chapter 8, pp. 314–327.

"A Variable–Resistivity Material for Memory Circuits", *NTIS Tech Notes*, NASA's Jet Propulsion Laboratory, Brief, Apr. 1990, p. 326.

"X–ray Lithography", Heuberger, *American Vacuum Society, J. Vac. Sci. Technol. B 6(1)*, Jan./Feb. 1988, pp. 107–121.

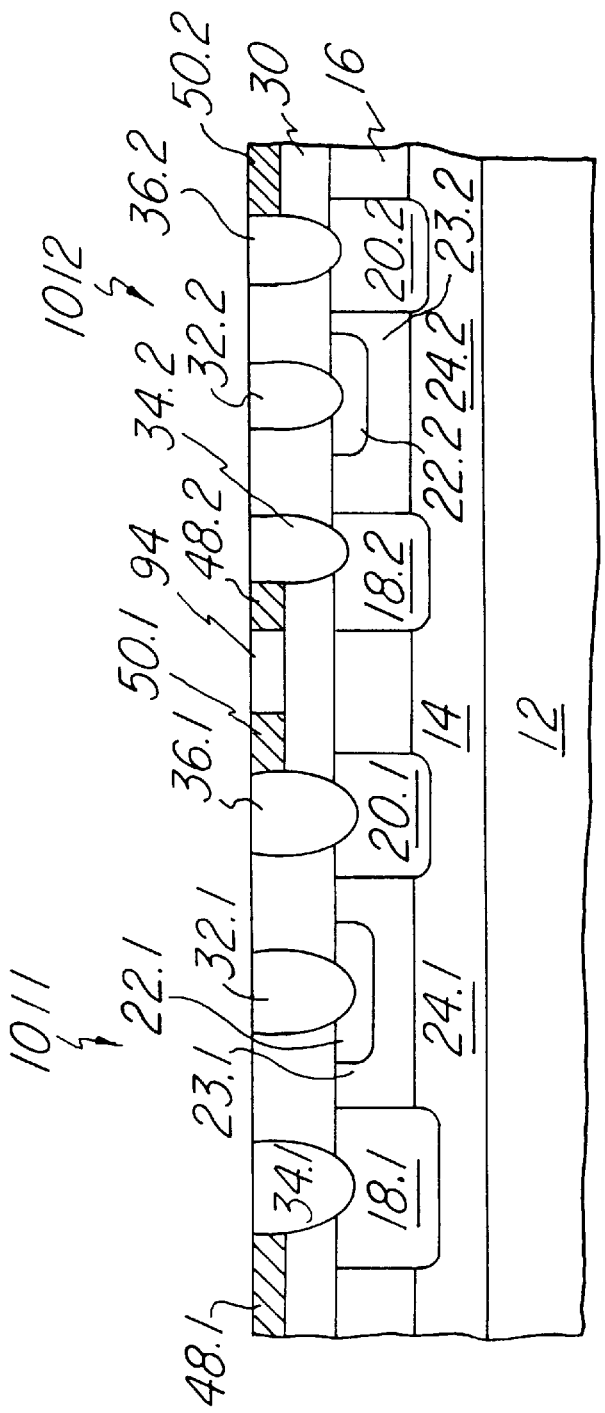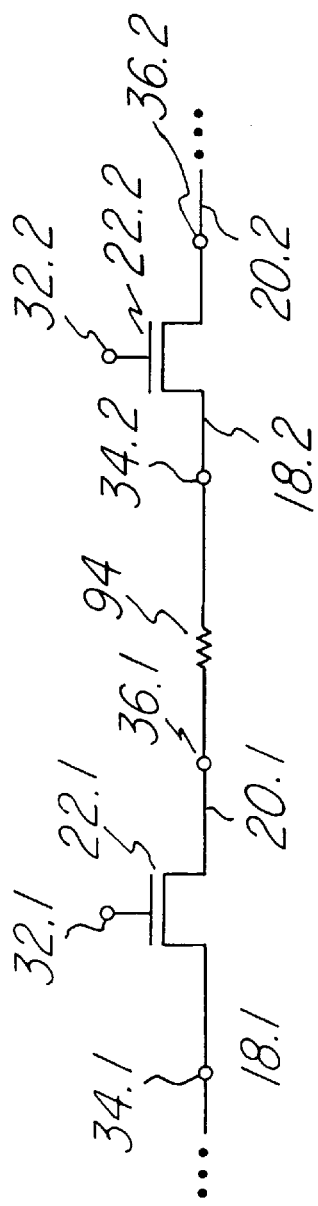
Fig.17a
Fig.17b

INTEGRATED CIRCUITS FORMED IN RADIATION SENSITIVE MATERIAL AND METHOD OF FORMING SAME

This is a division of application Ser. No. 08/479,281, filed Jun. 7, 1995 (issue fee paid), which is a division of application Ser. No. 08/037,050, filed Mar. 25, 1993 (U.S. Pat. No. 5,567,550).

CROSS-REFERENCE TO RELATED APPLICATIONS

The following co-assigned patent applications are hereby incorporated herein by reference:

| Serial No. | Filing Date | TI Case No. |
| --- | --- | --- |
| 590,259 | 9/28/90 | TI-15105 |

1. Field of the Invention

This invention generally relates to the fabrication of semiconductor devices and specifically to polyimide integrated circuits and methods.

2. Background of the Invention

The field of the invention is in the manufacturing processing of integrated circuit (IC) chips, including IC packages and dies with transistors, interconnects and other microscopic elements and structures, and processing of printed wiring boards. The field of the invention also involves the printed wiring boards, IC packages, and IC dies themselves, as well as smart power devices, digital computers and data processing systems.

Without limiting the scope of the invention its background is described in connection with chip fabrication.

Advanced VLSI chips are typically built with layers of metalization. The metal layers are separated by insulators which can typically be CVD (chemical vapor deposition) oxides. Polyimides have been proposed as interlayer dielectrics. These compounds may be applied by spinning and then are cured at temperatures between 300° C. and 350° C. This process produces a planar surface that is ideal for metallization. In the past, however, it has been found that organic compounds have limited thermal stability at elevated temperatures (e.g., >300° C.) and are porous to moisture penetration. See Sze, *VLSI Technology*, 2nd ed., p. 267 (1988).

Due to the widespread applications of IC (integrated circuit) chips, improvement is desirable in their manufacture to even further increase reliability and yields and to reduce costs.

SUMMARY OF THE INVENTION

Other objects and advantages will be obvious, and will in part appear hereinafter and will be accomplished by the present invention which provides a method and device for polyimide integrated circuits.

A transistor device is disclosed herein. A doped layer of a radiation sensitive material is formed over a substrate. The radiation sensitive material may be polyimide, polybenzimidazole, a polymer, an organic dielectrics, a conductor or a semiconductor and the substrate may be silicon, quartz, gallium arsenide, glass, ceramic, metal or polyimide. A neutral (undoped) layer of radiation sensitive material is formed over the doped layer. First and second source/drain regions are formed in the neutral layer and extend to a top portion of the doped layer. A gate region is formed in a top portion of the neutral layer between the first source/drain region and second source/drain region such that a channel region is formed in the doped layer beneath the gate region.

A method of forming a transistor device is also described herein. A polyimide (or other radiation sensitive material) layer is formed (e.g., spun on) on a substrate and doped to form a doped polyimide layer. An undoped polyimide layer is formed over the doped polyimide layer. The undoped polyimide layer is irradiated to form first and second source drain regions which extend to a top portion of the doped polyimide region. A top portion of the undoped polyimide is also irradiated to form a gate region between the first source/drain region and second source/drain region. A channel region is thereby formed in the doped layer beneath the gate region.

In one aspect, the present invention provides a complete alternative organic semiconductor integrated circuit technology which elaborates the structures and processes described in co-pending patent application Ser. No. 590,259 filed on Sep. 28, 1990 and incorporated herein by reference. These structures have a common material which means that temperature cycle reliability issues are eliminated. In addition, use of inexpensive substrates is a major cost savings.

Devices of the present invention may be fabricated to overcome the problems with organic compounds noted by Sze. The materials described herein should be stable up to at least about 200° C. This temperature limit should not adversely effect the device. In fact, assembly and soldering can be done at lower temperatures and device operation is typically less than about 125° C. In addition, the radiation sensitive layers described herein can be protected from moisture penetration with a nitride or oxynitride overcoat. It is noted that oxides are also porous to moisture penetration.

Further, the simplicity of the processing steps makes the present invention useful for large structures such as LCD displays as well as low-defect VLSI class devices. For example, in one embodiment, resolution is established by the excimer laser which is in the deep submicron. The present invention can be used as an alternative to standard CMOS technologies.

Still further, advantageous isolation of the transistors is inherent in structures formed from insulating precursor material. Also, switching speed is related to the dielectric isolation and is expected to be competitive with conventional junction isolated technologies.

Because of the dielectric isolation, SRAMS can be built with SOI-like soft-error immunity. These transistors could be coupled to a capacitor, giving a DRAM with complete isolation of the array from the substrate; this would give excellent alpha particle immunity.

Yet another technical advantage of the invention is that it simplifies manufacture of integrated circuits in some embodiments. Prior art planarization problems are reduced or eliminated. Vias can be greatly simplified. New flexibility in design is conferred. In another embodiment, printed circuit boards can have radiatively introduced interconnects and even electronic elements embedded therein. Other advantages are described or are apparent from the present description.

BRIEF DESCRIPTION OF THE DRAWINGS

The above features of the present invention will be more clearly understood from consideration of the following descriptions in connection with accompanying drawings in which:

FIG. 17a illustrates an embodiment which includes a resistive interconnect and FIG. 17b illustrates an equivalent circuit;

Corresponding numerals and symbols in the different figures refer to corresponding parts unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of the structure and method of the present invention. A preferred embodiment transistor structure will be described first followed by a description of fabrication steps. A radiation mask and a method for fabricating this mask will then be described. Modifications and variations in the transistor structure will next be described as well as exemplary contact and interconnect structures. Some applications will also be described. A second preferred complementary embodiment will then be described. A description of applications, including a printed circuit board with active devices formed thereon, will then be provided.

Figure 1:
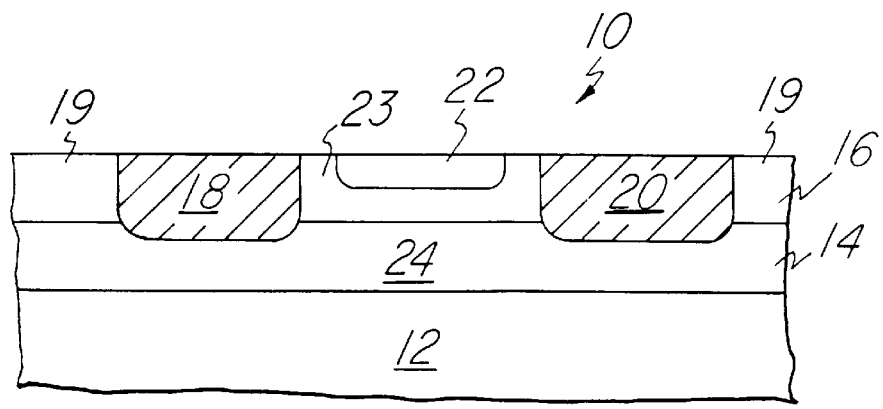
FIG. 1 illustrates a cross-sectional view of a first embodiment transistor structure.

Referring first to FIG. 1, a workpiece 10 is illustrated. A substrate 12 has a polymer layer 14 formed thereon. In a preferred embodiment the substrate 12 may comprise silicon or quartz, although other substrates may also be used. Other semiconductor substrates such as germanium, gallium arsenide, barium strontium titanate or mercury cadmium telluride may alternatively be used. Lithium niobate substrates may also be used. In the preferred embodiment, the polymer layer 14 comprises a doped polyimide layer and has a thickness of between about 0.1 and 2.0 microns with a presently preferred thickness of about 1 micron.

A second polymer layer 16 is formed above the doped polymer layer 14 and typically has a thickness between about 0.1 and 0.5 microns with a presently preferred thickness of about 1000 angstroms. The maximum thickness of the layer 16 is limited by the maximum thickness which can be irradiated through (as will be described with respect to FIG. 3) without damaging the device surface. This thickness may theoretically be larger than 0.5 microns. The polymer layer 16 is typically undoped.

Formed within the polymer layer 16 are source region 18, drain region 20 and gate region 22. The source 18 and drain 20 regions comprise more heavily irradiated regions and as shown may extend into doped polymer layer 14. A channel region 24 exists in the upper portion of the layer 14 between source region 18 and drain region 20. The channel region 24 is separated from the gate region 22 by a gate insulating region 23. When the gate region 22 is properly biased, current can flow from source 18 to drain 20 through channel 24. Of course, the source and drain regions can be operationally reversed depending upon the specific application.

In one example, the polymer layer 14 comprises a p-doped polyimide layer and the polymer layer 16 comprises an undoped or neutral polyimide layer. The source 18, drain 20, and gate 22 comprise irradiated polyimide with the gate typically more lightly irradiated than the source and drain.

The transistor device 10 may be one of many devices formed within a single integrated circuit. Isolation regions 19 will isolate the device 10 from other devices in the circuit. Since isolation regions 19 comprise portions of the undoped layer 16 which have not been irradiated, no additional steps are required. In standard silicon technology, on the other hand, isolation regions such as field oxides or trenches must be specifically formed with additional processing steps. The elimination of these additional steps is another advantage of the present invention.

Any substrate 12 which is physically compatible with polyimide, PBI (polybenzimidazole) and/or other radiation responsive polymer or other films can be used. Examples include silicon, quartz, gallium arsenide, glass, ceramic, metal, polyimide, and any other substrate materials preferably compatible in adhesion and thermal expansion properties which the skilled worker selects for this purpose.

Many polymers are applicable for the present purposes. Linear all-aromatic polyimides are one example. Solubility is increased by using alternatives of polyimides that have 1) aromatic pendant groups on the polymer backbone, or 2) varying isomeric points of attachment of bridging groups in diamine monomers of the polymer, or 3) using —CF3 and/or —SO2 groups. Polyimides can also be prepared with biphenyltetracarboxylic dianhydrides in a solvent of N-methylpyrrolidone. Methods for preparing polyimides are discussed in the co-pending Ser. No. 07/590,259 (TI-15105) patent application.

In the above description polyimide is but one instance of organic semiconductor which is amenable to doping with gaseous species and to treatment by irradiation to accomplish the structures described. The substrate material type is similarly flexible. For instance, a metal overlain with thick insulator can also be used as an inexpensive substrate.

It should be noted that an npn parasitic transistor is inherent in the structure of FIG. 1. In the parasitic device, the source 18 acts like an emitter and the drain 20 like a collector. The layer 14 is the base. Connection to the p− base can be provided and, if so, is preferably supplied with a connection to the source to shut off the parasitic device where the parasitic is to be suppressed. Thus, in a MOS device, the p− base potential is advantageously controlled by ohmic contact whereby the p− base is back-biased. The goal is to make a p+ contact on the front surface; this can be accomplished with a mask implant of boron.

The parasitic device can be arranged to advantageously come into play in an overstress or ESD (electrostatic discharge) event. When the back gate potential is allowed to rise due to drain-to-backgate breakdown, then the npn parasitic transistor will turn and dissipate the energy to the source 18 (e.g., ground potential or return potential).

A preferred method for fabricating a transistor device such as the one shown in FIG. 1 will now be described with respect to FIGS. 2 and 3.

Figure 2:
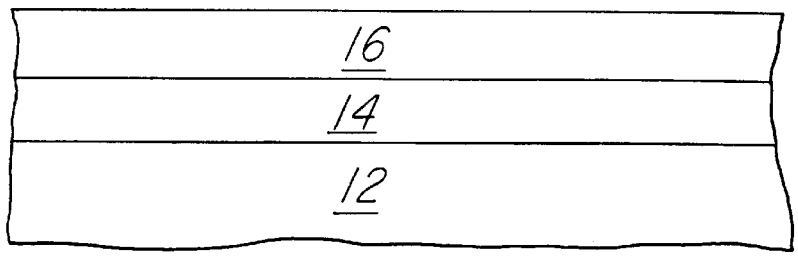
FIGS. 2 and 3 illustrate process steps to form the structure of FIG. 1.

Referring now to FIG. 2, a doped (e.g., p doped or n doped) polyimide layer 14 is spun-on to a thickness of about 1 micron. A quartz or silicon substrate 12 is easily available for spinning and other processes although other substrates may be used as discussed above.

An additional layer 16 of neutral or undoped polyimide is formed above layer 14. The neutral layer 16 may typically be between about 1000 and 5000 Angstroms thick and is preferably about 1000 Angstroms thick.

Figure 3:
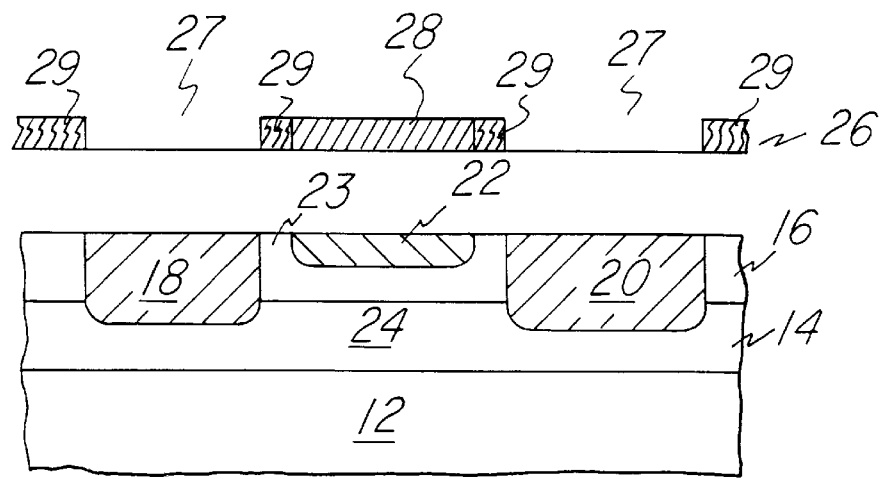

Referring next to FIG. 3, the film 16 is heavily irradiated through mask 26 to form source 18 and drain 20 which can go through the neutral layer 16 to the lightly doped layer 14. Also lightly irradiated gate region 22 is formed only in a top portion of the neutral polyimide layer 16. This step leaves a region in the lower portion of undoped layer 16 for gate insulator 23 between the gate 22 gate and the lightly doped polyimide region 14, i.e., the channel 24.

Since carbon of polyimide is very similar to silicon in the periodic table, dopants such as gallium and boron provide a similar p-doping function in the organic film. In one example of the preparation of the polyimide, the polymer is reacted in a diborane atmosphere to replace some of the carbon sites with boron sites. The conduction of the basic films in present experiments burns off hydrogen and leaves carbon by the irradiation process. With boron provided into the polymer in the process of polymerization before the irradiation step, the irradiation step goes on to produce a substance with interstitial boron, thus leaving boron as acceptor dopant in place of carbon in the semiconductive substance which is the overall result of the process.

In one process embodiment, a doping step dopes the polymer with a fixed density of doping sites. During the manufacturing process of the polymer or a constituent thereof, a dopant species is incorporated into the polymer as an anion to replace a hydrogen bond on the polymer. The polymer is applied to the workpiece as described elsewhere herein. Selective irradiation activates the doping sites with photons creating semiconductive areas and rectifying junctions. Suitable dopants for incorporation in the radiation sensitive material such as polymer include any elements on either side of the periodic table from carbon, such as elements in groups III or V or elements in groups II or VI.

Boron, arsenic and phosphorus are exemplary dopants. The dopants are incorporated in the polymer by replacing hydrogen in the polymer units in a molar ratio of between 1 millimole to 1 mole per mole of polymer constituent. Still other examples of dopant species and compounds are halogens or silver halide wherein the halides can be bromine and iodine for instance. It is also contemplated to fabricate semiconductors with undoped films. The doping sites are made to occur by changing the morphology of the film by the irradiation itself. This provides semiconductive and rectifying behavior at IC thicknesses on the order of a micron. In an alternative embodiment, resistivity of the polymer is varied or modulated over more than 10 orders of magnitude with argon Ar+ dopant doses on the order of 10 to the 15th to 16th power per square centimeter (cm−2). Hydrogen and neon ions are also suitable.

Radiation as used herein includes any radiant energy or particle radiation to which a dielectric substance is responsive to provide a conductive region or to which a conductive substance is responsive to provide a less conductive or dielectric region. Photon or electromagnetic radiation includes x-rays, gamma rays, ultraviolet, visible light, and infrared. Particle radiation includes electrons, ions and other particles such as subatomic particles. Radiation also includes ultrasonic vibrations, and any other forms of energy or matter for transforming a radiation sensitive material to make part of it conduct or insulate. Materials having this sensitivity include polyimides, PBI (polybenzimidazole), other polymers, other organic dielectrics, conductors and semiconductors, and other sensitive substances.

Experimental observations have lead to some conclusions about advantageous characteristics of some preferred embodiment processes of integrated circuit fabrication. The radiation sensitive insulative material to be deposited as a layer should preferably have an ablation threshold and a conductivity threshold to radiation wherein the ablation threshold exceeds the conductivity threshold. The material preferably has a resistivity which is alterable by irradiation over at least 15 orders of magnitude. Many of the materials such as polyimide, PBI and other polymers are insulators before irradiation. The material should be deposited to have a surface smoothness or uniformity compatible with subsequent layer deposition in integrated circuit manufacture. One definition of surface smoothness is variation in thickness in a localized area. A localized area can be taken as a region with a 100 micron width or a region of a circuit cell such as a memory cell when the latter is present. The thickness should vary less than one micrometer and preferably less than one-half, one quarter or even one-tenth of a micrometer both upon deposition and after irradiation.

For high resolution or definition of conducting lines, areas and devices, selective irradiation of a radiation sensitive layer preferably uses radiation having a wavelength at least as short as ultraviolet. This is because resolution is generally proportional to wavelength.

Returning to FIG. 3, remarkably, the gate 22, source 18 and drain 20 can be irradiated through a single mask 26. A region 28 above the gate 22 partially absorbs (or reflects) the irradiation causing the gate 22 to be less heavily irradiated than the source 18 and drain 20 which are irradiated through material 27. The alignment problem of gate positioning relative to source and drain is therefore eliminated because the mask itself establishes the relative positions. The spacers 29 can be deep submicron on the order of 0.1 micron. The semitransmissive region 28 can have a transmission coefficient on the order of about 0.1 to 0.2, for example, without excluding other values.

An alternate method of fabrication utilizes a direct write scheme. An advantage of a direct write scheme is that mask 26 may be eliminated. In one embodiment, the duration and/or intensity of the beam will be varied as the beam scans the wafer. Where conductive regions are desired, the beam may be completely off. Where either shallow regions (such as region 22 in FIG. 3) or resistive regions (as will be described hereinafter) the intensity of the beam may be lowered from a peak intensity which is used for the higher conductivity or deeper regions. In another embodiment, the beam intensity may vary between only two levels (e.g., on and off) and the resistivity and/or depth can be varied by duration of irradiation. In one example, the scan rate may be varied. That is, the beam will be scanned more quickly for lower conductivity or shallower regions and will be scanned more slowly for higher conductivity or deeper regions. Alternatively, the beam may be scanned multiple times at the same rate but turning it on for more iterations for the lower resistance regions. Variations and combinations of these various methods may also be utilized.

Figure 4A:
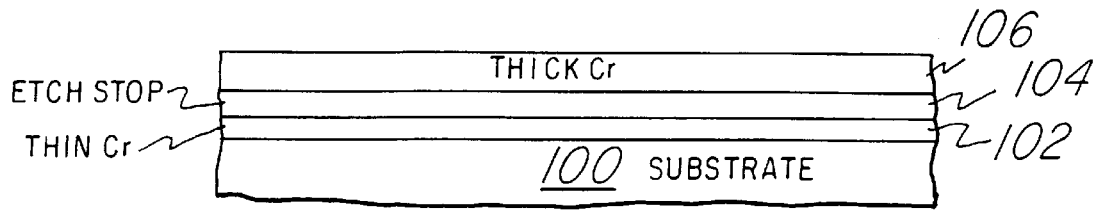
FIGS. 4a–4c illustrate process steps for forming a radiation mask which is used in the preferred embodiment fabrication process.
Figure 4B:
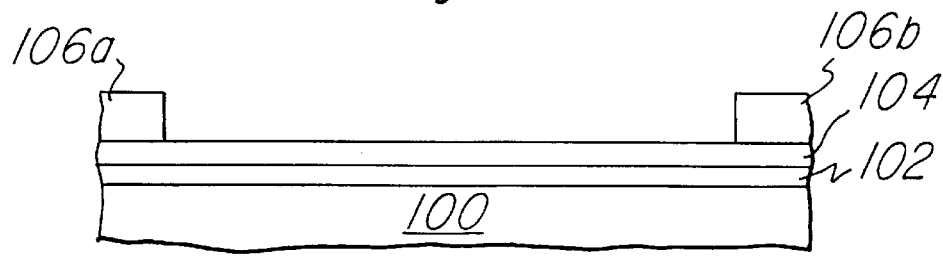
Figure 4C:
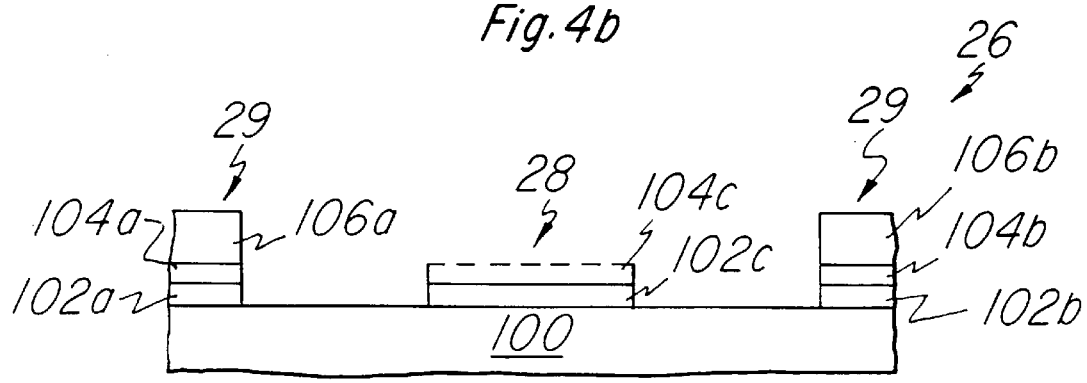

A method for fabricating an irradiation mask 26 is illustrated in FIGS. 4a through 4c. Referring first to FIG. 4a, a substrate 100 is provided. The substrate 100 may preferably comprise quartz. An exemplary substrate may normally be about 1 mm thick, but this thickness may vary widely. Other substrate materials such as fused silica or a semiconductor such as silicon may alternatively be used. The substrate 100 is chosen for its radiation transmission characteristics as well as its structural characteristics.

A thin transmissive layer 102 is formed on the surface of substrate 100. The thin transmissive layer 102 preferably comprises chrome (as shown) but may also comprise any of a large number of materials including aluminum, gold and silver. The thin layer 102 may be about 50 to 1000 Å thick. The thickness can be adjusted to set attenuation of the radiation. In fact, there may be regions of varying thicknesses depending upon the design. The layer 102 may be evaporated or sputtered on the substrate 100.

An etch stop layer 104 is formed over thin transmission layer 102. The etch stop layer preferably comprises an oxide or a nitride and may be deposited by a chemical vapor deposition process.

A thick opaque (i.e., non-transmitting ) layer 106 is formed on the etch stop layer 104. The thick layer 106 preferably comprises chromium and is between about 0.5 and 1.0 microns thick. The thick layer 106 is thick enough that radiation will not be transmitted therethrough. The thick layer 106 may alternately comprise a large number of materials including aluminum, gold, or silver and may or may not be the same material as thin layer 102.

Referring now to FIG. 4b, a first mask layer (not shown) is formed over layer 106 and is patterned using standard photolithographic techniques. The thick layer 106 is then etched such that only the non-transmissive regions remain. The etch process will not damage the thin layer 102 because of layer 104. If different materials are used for layers 102 and 106 and a selective etch chemistry is available, the etch stop layer 104 may be eliminated. The remaining regions 106a and 106b are equivalent to the regions 29 illustrated in FIG. 3.

After the first mask layer is removed, a second mask layer (not shown) is formed and patterned. The second mask will be used to form the transmissive regions, such as the region 28 in FIG. 3. The etch stop layer 104 and the thin layer 102 are then etched. The resulting structure is illustrated in FIG. 4c. As shown in the figure by the dashed lines, the etch stop layer 104c may subsequently be removed, although ordinarily the additional step required to do so may be eliminated.

The mask structure 26 may then be used to irradiate different regions of a device being fabricated with different radiation levels. By utilizing additional chromium (or other material) layers and etch stop layers more radiation transmissivity levels can be achieved. Several embodiments which use multitransmissivity level masks will be described below with respect to FIGS. 12–14 and a preferred method for forming the mask will described with respect to FIGS. 15a–15d.

It should also be noted that the mask 26 can be a 1×, 5× or 10× mask, as examples. The magnification of the mask would depend upon the optics in the system.

Figure 5:
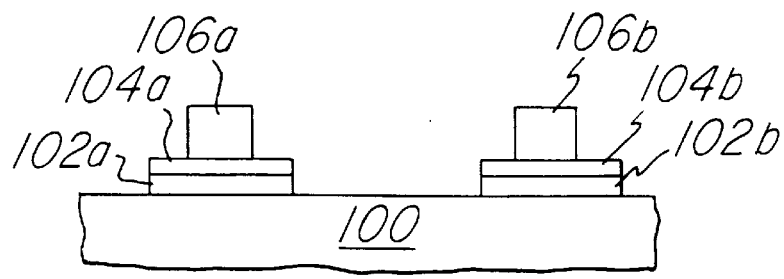
FIG. 5 illustrates a phase shift mask which may be formed by the process described with respect to FIGS. 4a–4c.

In addition, a phase shift mask 25 can also be formed by the process described herein. An example is illustrated in FIG. 5. The thick layers 106 overlap the portions of the etch stop 104 and thin layers 102.

Figure 6:
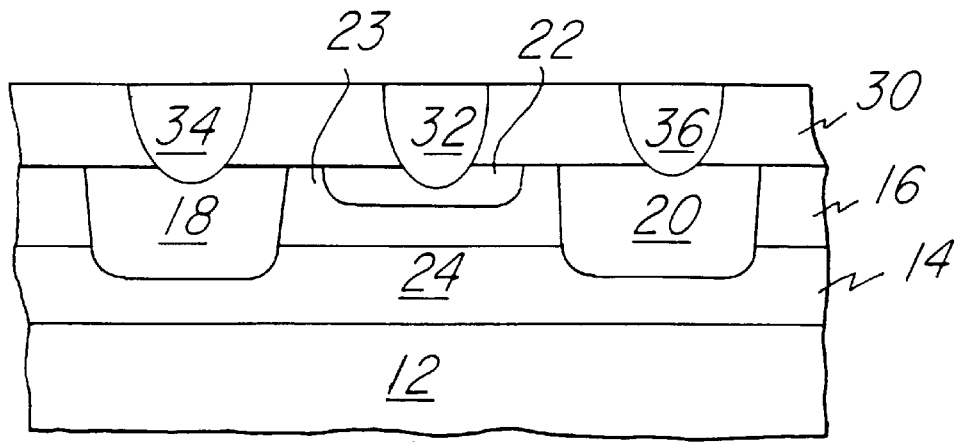
FIG. 6 illustrates a transistor structure which includes contacts.

Returning to the transistor device structure and method of the present invention, a transistor structure including contacts is illustrated in FIG. 6. Examples of transistor structures including contacts and interconnects are illustrated in FIGS. 7 and 8.

Referring now to FIG. 6, a third neutral layer 30, of polyimide for example, is spun on with thickness on order of about 0.1 to 0.2 microns and heavily irradiated to provide contacts to the gate 22, source 18 and drain 20, labeled in FIG. 4 as contacts 32, 34 and 36, respectively. Additional layers of approximately the same 0.1 to 0.2 microns thickness can be spun on to provide successive interconnect and via formation. More details of forming interconnect contacts are described in the co-pending Ser. No. 07/590,259 (TI-15105) patent application.

Figure 7:
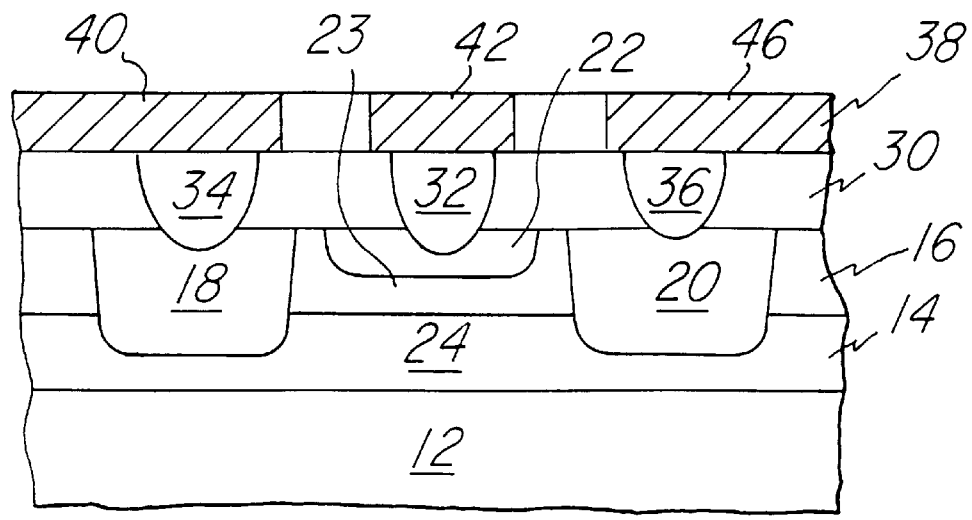
FIGS. 7 and 8 illustrate a transistor structure which includes contacts and interconnects.

Referring next to FIG. 7, interconnect polymer layer 38 is formed overlying contact polymer layer 30. Interconnect layer 38 typically comprises an undoped layer and may typically be in the range of about 0.1 to 2 microns thick and is preferably about 0.2 microns thick. Interconnect lines can be irradiated to form interconnect lines to other devices on the circuit. Interconnect lines 40, 42 and 46 have been shown in FIG. 7 to illustrate a possible configuration. It is noted that the interconnections can be formed either into a plane normal to the substrate surface or in a plane parallel to the substrate surface in any direction. In addition, interconnects at other angles could be formed by adjusting the angle of incidence of the radiation source. It is also noted that although only a single interconnect level is illustrated, multiple levels of interconnects can be formed.

Figure 8:
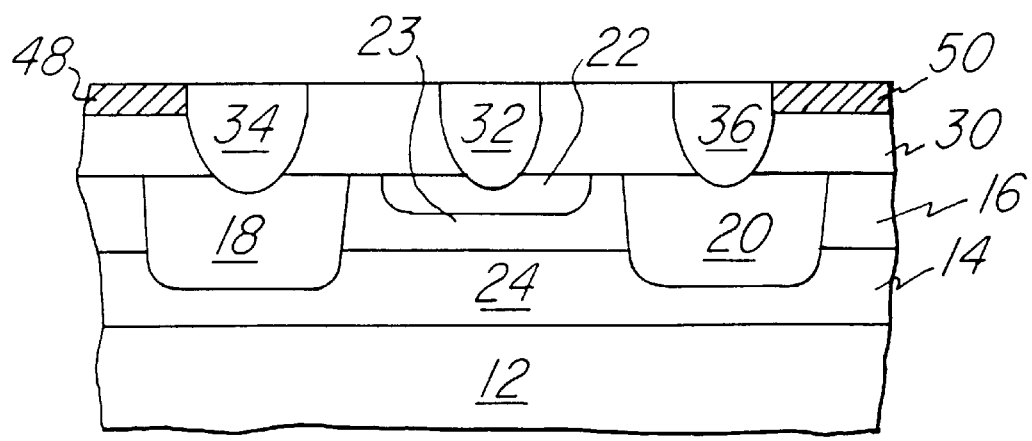

An alternate interconnect structure is illustrated in FIG. 8. In this case, exemplary interconnects 48 and 50 have been formed in the same layer 30 as contacts 32, 34 and 36. The interconnects 48 and 50 can be formed during the same masking step as the contacts (without irradiating as deeply) with a mask formed as described with respect to FIGS. 4a–4c. Alternately, the interconnects 48 and 50 can be formed in a second irradiation step.

Figure 9A:
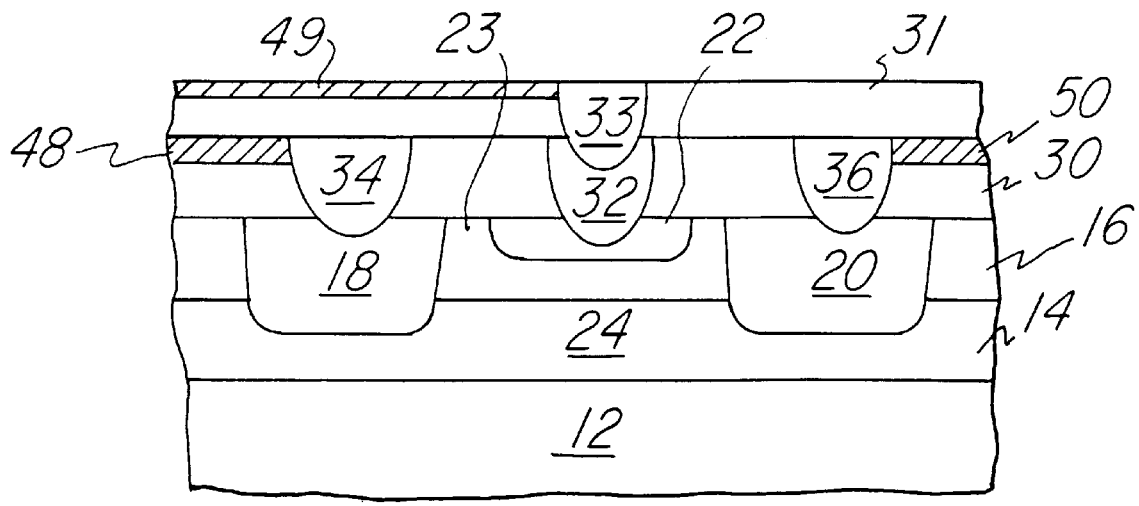
FIG. 9 illustrates a transistor structure which includes multiple levels of contacts.
Figure 9B:
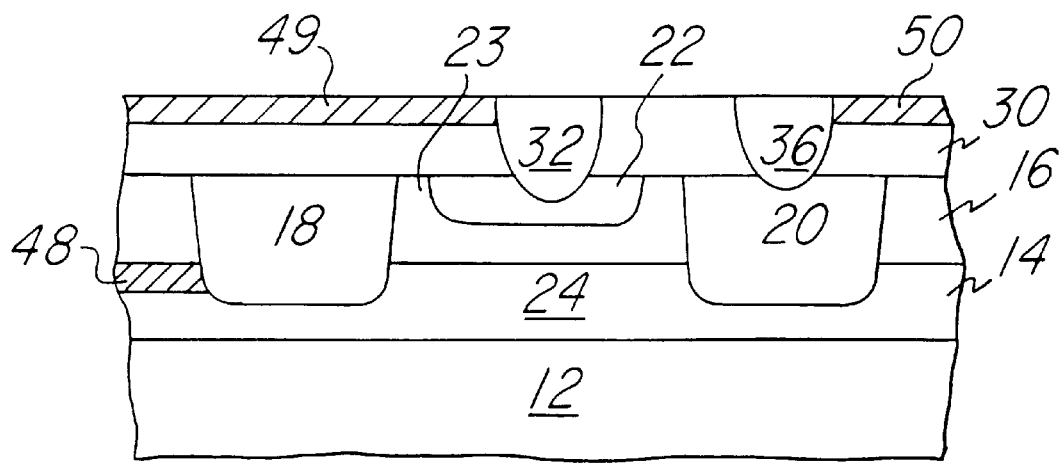

Multiple levels of interconnects can also be used illustrated in FIGS. 9a and 9b. In the example of FIG. 9a, a layer 31 of radiation sensitive material is formed over a structure such as the one illustrated in FIG. 8. A contact 33 is formed through the layer 31 as described herein. The contact 33 is aligned to electrically conduct to the contact 32 in layer 30. An interconnect line 49 can then be formed in the layer 31 to couple the gate region 22 to other components within the circuit.

Referring now to FIG. 9b, another embodiment (which may be used in combination with embodiments previously discussed or to be discussed) is illustrated. In this example, an interconnect line 48 is formed in the layer 14. One advantage of this scheme is that a contact layer is eliminated. Using this method does, however, require a masking and irradiation step prior to forming layer 16. Although this does make alignment more critical, this method provides a technique for doping the lower portions of the source/drain regions 18 and 20. In this manner, the portion of the source/drain regions in a plane parallel with the channel 24 will be more highly doped creating a potentially better transistor.

Figure 10:
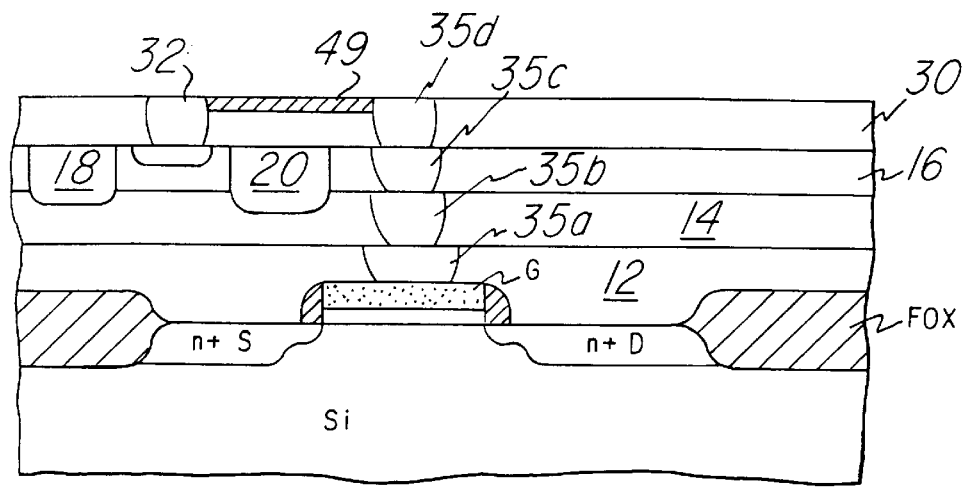
FIG. 10 illustrates a transistor structure of the present invention which is formed over a semiconductor transistor.

FIG. 10 illustrates yet another embodiment. In the embodiment illustrated here, the transistor formed in the radiation sensitive material is used in conjunction with semiconductor devices. In this example, an ordinary transistor including a source S, drain D and gate G are formed in a silicon substrate. Field oxide regions FOX are also illustrated. This silicon transistor is provided to give an example of a semiconductor device. Other semiconductors such as germanium, gallium arsenide, barium strontium titanate or mercury cadmium telluride may alternatively be used. In this illustrative example, the gate of the silicon transistor will be coupled to the gate of the radiation sensitive transistor.

A layer of radiation sensitive material 12 is formed over the surface of the silicon transistor device. A contact 35a is formed in the layer 12 to electrically contact the silicon transistor gate G. Radiation sensitive layers 14, 16 and 30 are then formed and a transistor device formed as previously discussed. Each of the layers has a contact 35 which will be used to electrically conduct to the gate G. The contact 35b will be formed prior to forming layer 16. The contact 35c can be formed along with source 18, drain 20 and gate 22. The contact 35d is formed along with contact 32 and interconnect line 49.

Figure 11:
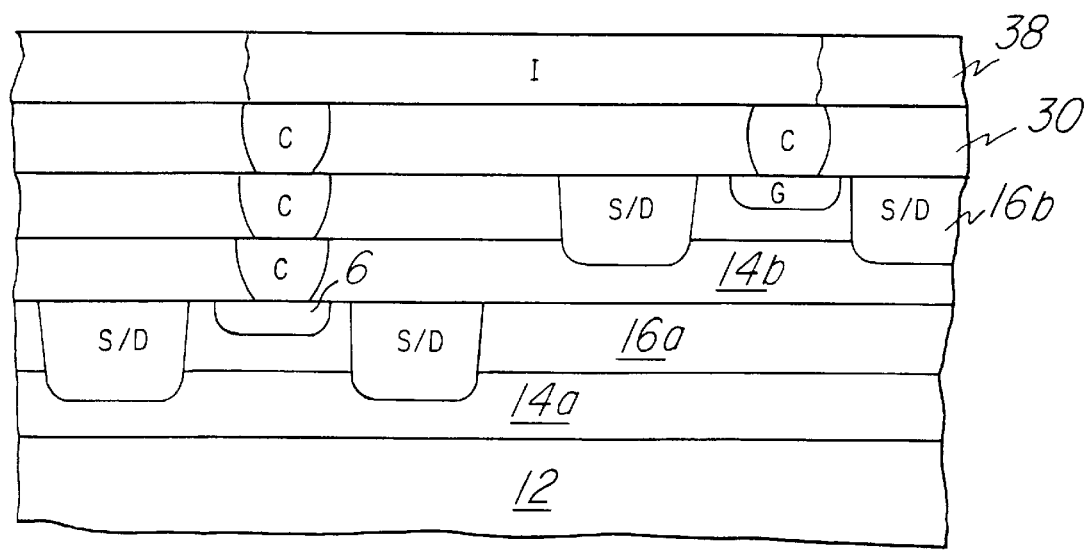
FIG. 11 illustrates an embodiment which includes multiple levels of transistors.

A similar structure can be used to build multiple layers of radiation sensitive transistors. An example of one such structure is illustrated in FIG. 11. Here two layers of devices are illustrated but integrated circuits with more layers are also anticipated. This embodiment provides an advantage in applications which require a large number of transistors such as memory arrays. The multi-level radiation sensitive transistor structure of FIG. 11 could also be formed on top of a semiconductor transistor as described with respect to FIG. 10

In FIG. 11, the source/drain regions are labeled S/D, the gate regions G, the contact regions C and the interconnect region I. Once again, the figure illustrates an embodiment of two transistors with gates coupled together. The interconnect line I is similar to the interconnect line discussed with reference to FIG. 7.

In another embodiment (illustrated in FIG. 14 for example), polyimide (or other materials as described herein) can also support the reciprocal polarity structures, with a first transistor having a n-doped drain and source along with a p-doped channel and a second transistor with a p-doped drain and source along with an n-doped channel. This provides complementary regions (analogous to tubs, tanks or wells in silicon technology).

This complementary structure can be accomplished by doping with phosphorous or arsenic, for example, in a process step in preparation of the liquid prepolymer by incorporating liquid or gaseous compound such as phosphene or arsene therein. Furthermore, complementary structures can be fabricated by gaseous doping of neutral polyimide.

Figure 12:
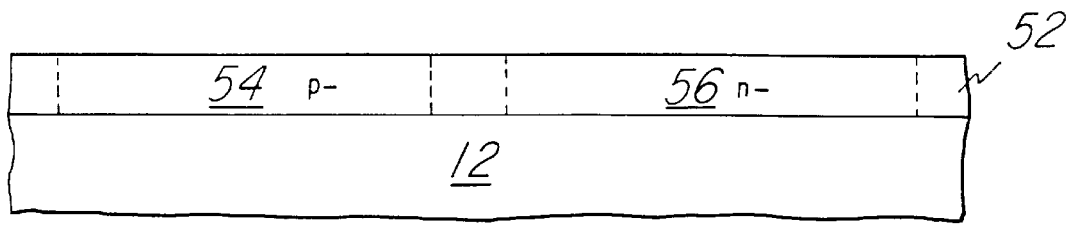
FIG. 12 illustrates a cross-sectional view of a structure with complementary well regions.
Figure 13:
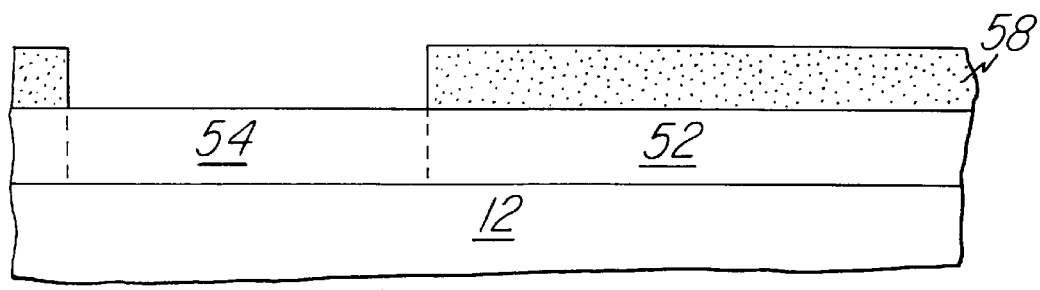
FIG. 13 illustrates a process step for forming a well region.

For example, as illustrated in FIG. 12, p– and n– regions are formed in neutral polyimide 52. FIG. 13 illustrates how each of the regions can be formed. First a mask layer 58, which may be a low temperature CVD oxide such as silicon dioxide for example, is deposited over the neutral polyimide layer 52. Next, the mask layer 58 is patterned and etched with a photoresist (not shown). For an oxide mask layer 58, plasma etching may be used. The etching step exposes a first exposed first region 54. After etching and before doping the photoresist (not shown) is removed. The first region 54 is then exposed to dopant gas such as diborane to establish a p– region 54. Next, the remaining portion of the mask layer 58 is removed. For example, the oxide can be removed by HF. The sequence beginning with oxide deposition and ending with oxide removal is then repeated for the second well region 56. For an n-doped region 58, the dopant gas can be phosphene or arsene.

Figure 14:
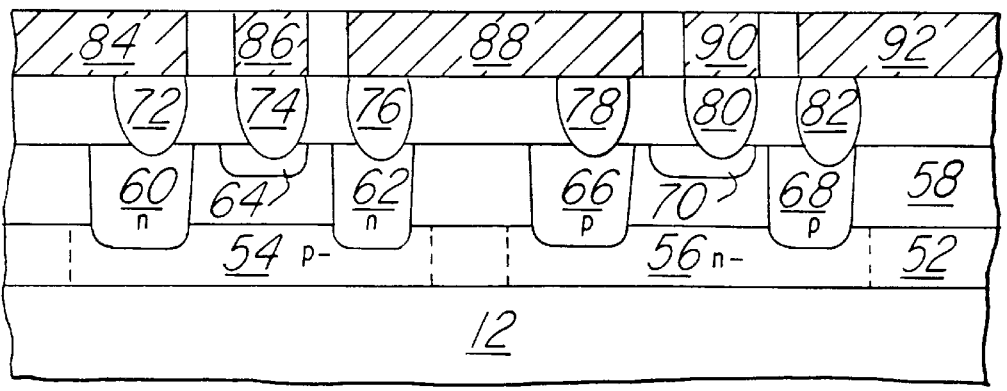
FIG. 14 illustrates a cross-sectional view of a complementary transistor embodiment.

Referring now to FIG. 14, a structure including a pair of complementary transistors established in the polyimide is illustrated. P-well region 54 and n-well region 56 are formed in a first radiation sensitive layer 52. Neutral radiation sensitive layer 58 overlies layer 52. Conductive (e.g., doped) source region 60, drain region 62 and gate region 64 are formed in layer 58 overlying the p-well region 54. As illustrated, the source 60 and drain 62 may extend into the layer 52. Likewise, conductive (e.g., p-doped) source region 66 drain region 68 and gate region 70 are formed in layer 58 overlying the n-well region 56. As illustrated, the source 66 and drain 68 may extend into the layer 52.

Also illustrated in FIG. 14 are contact regions 72, 74, 76, 78, 80, and 82 and interconnect regions 84, 86, 88, 90, and 92 which couple the elements of the devices to other elements in the circuit (e.g., other transistors, resistors, diodes, capacitors, bond pads or other elements). The interconnect regions shown in FIG. 14 are arbitrarily chosen to illustrate the principal.

Unlike CMOS (complementary metal oxide semiconductor) technology, this technology can use but does not require any metal or oxide. Accordingly, this technology can be called complementary doped organic semiconductor (CDOS) technology. In FIG. 14, the p– and n– doped wells of a first neutral polyimide base layer on quartz (or polyimide or any other insulating substrate or silicon or other semiconductive substrate) are overlain with a s/g/d (source/gate/drain) structure in neutral polyimide second layer according to the description of FIGS. 1–3. Next, a third neutral polyimide layer provides respective contacts to the s/g/d structure as described with respect to FIG. 6. A next subsequent fourth neutral polyimide layer has interconnects irradiated there into to connect with the contacts as described with respect to FIGS. 7 and 8.

Structures and circuits including both complementary (e.g., FIG. 14) and single conductivity type (e.g., FIG. 1) can be formed in the same integrated circuit.

Figure 15:
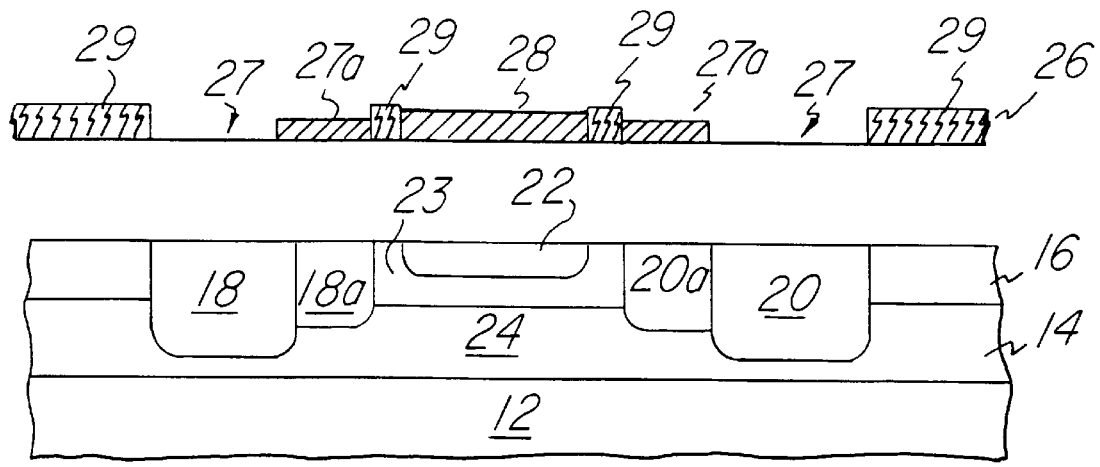
FIG. 15 illustrates a transistor which includes lightly irradiated source/drain regions.

Another variation of the integrated circuit transistor 10 of the present invention is illustrated in FIG. 15. The transistor in FIG. 15 includes lightly irradiated source/drain regions 18a and 20a (analogous to LDD regions in silicon technology formed adjacent to source/drain regions 18 and 20. The lower conductivity regions 18a and 20a can preferably be formed during the irradiation step which forms the main source/drain regions 18 and 20. In a preferred embodiment, this structure is achieved by using a mask 26 which includes semi-transparent regions 27a. In this example, the transmissivity of the mask regions 27a is greater than the transmissivity of the semitransmissive regions 28 but less than the transmissivity of the substantially transparent regions 27. This mask feature allows the regions on the integrated circuit to be any desired resistance and/or depth.

Figure 16:
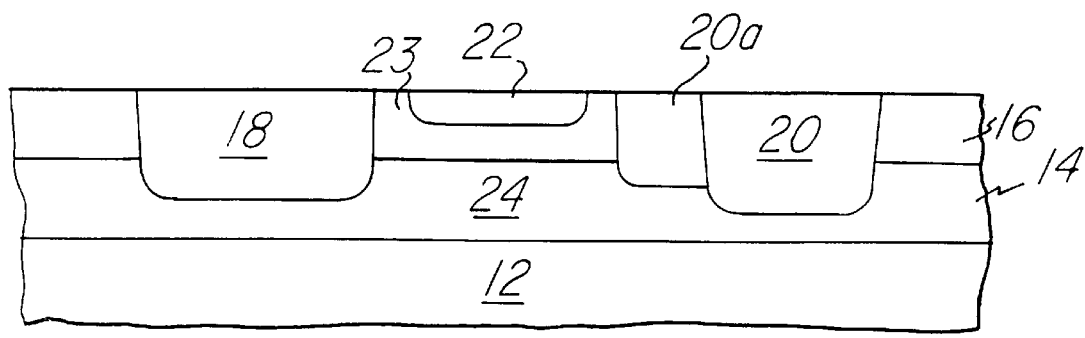
FIG. 16 illustrates an asymmetric transistor which includes a single lightly irradiated source/drain region.

A similar embodiment including a lightly irradiated source/drain region 20a is illustrated in FIG. 16. The transistor in this figure is asymmetric. In other words, the drain 20 includes a lightly irradiated drain region 20a but the source 18 includes only a single region 18. In an embodiment not illustrated, the source 18a may be included while the drain 20a is not. These structures are preferably fabricated using a single mask with regions of varying transmissivity as discussed with respect to FIG. 15.

In another embodiment which uses a radiation mask 26 similar to the one discussed with reference to FIG. 15 is illustrated in FIG. 17. FIG. 17a illustrates two transistors 10.1 and 10.2 which are each similar to the transistor device illustrated in FIG. 8. In this particular (and arbitrarily chosen) embodiment, it is desired to resistively couple the drain 20.1 of the first transistor to the source 18.2 of the second transistor. A resistive region 94 is included within the interconnect line. An equivalent circuit diagram is illustrated in FIG. 17b.

The resistive region 94 is preferably formed with a single mask with regions of varying transmissivity as discussed with respect to FIG. 15. The portion of the mask which corresponds to the resistive region 94 has a low transmissivity than the mask portion which corresponds to interconnect lines 48 and 50.

Although illustrated with only a simple two transistor embodiment, the inventive concepts may be applied to a wide variety of circuits. A number of different resistance values can be obtained simply by forming regions of different transmissivity on the irradiation mask. Circuits such as voltage dividers or even analog-to-digital (or digital-to-analog) converters can be formed. These circuits can be formed with a single masking step. In these embodiments, the majority of the precision effort is spent on fabricating the mask which can subsequently be used in the fabrication of a large number of integrated circuit devices.

The fabrication steps of a preferred embodiment method for forming a mask with multiple transmissivities is illustrated in FIGS. 18a through 18d. The process flow here is similar to the process flow described with respect to FIGS. 4a through 4c. The mask illustrated in FIG. 18 can be used to form a transistor device like the one shown in FIG. 15.

Figure 18A:
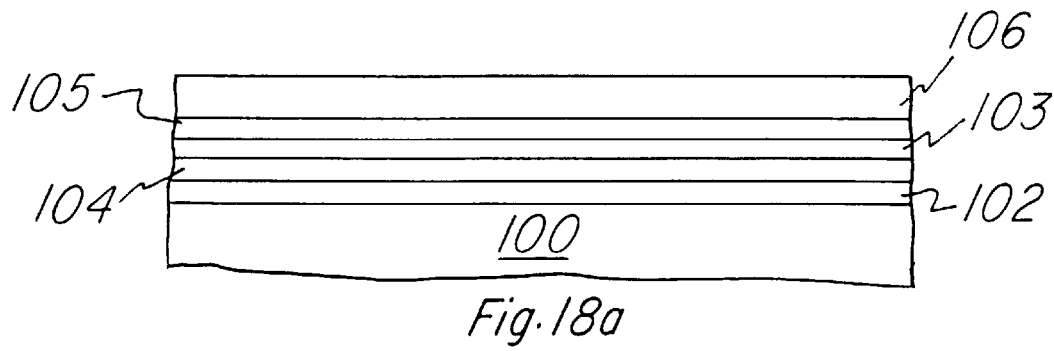
FIGS. 18a–18d illustrate process steps for forming a radiation mask which is used in the preferred embodiment fabrication process for devices which require regions with different conductivities and/or depths.

Referring first to FIG. 18a, a substrate 100 is provided as described above. A thin transmissive layer 102, preferably chrome, is formed on the surface of substrate 100. An etch stop layer 104, possibly an oxide or nitride layer, is formed over thin transmission layer 102. Additional transmissive layers 103 and etch stop layers 105 may then be alternately formed. Although illustrated with only one additional set of transmissive/etch stop layer (since the device being fabricated requires only three different conductivity regions), it should be understood that more layers can be formed. Finally, a thick opaque (i.e., non-transmitting) layer 106 is formed on the final etch stop layer 105.

Figure 18B:
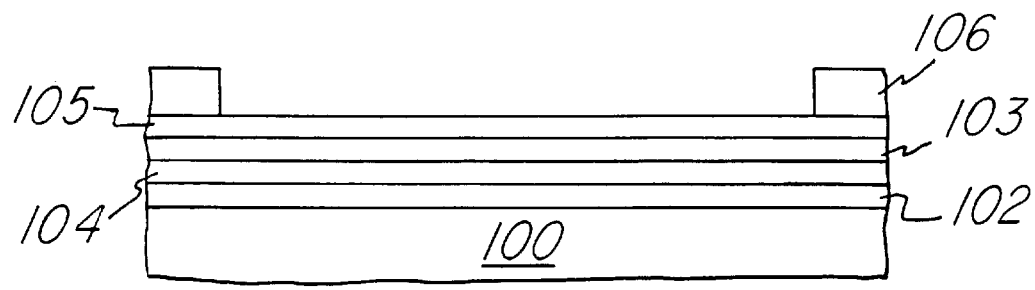
Figure 18C:
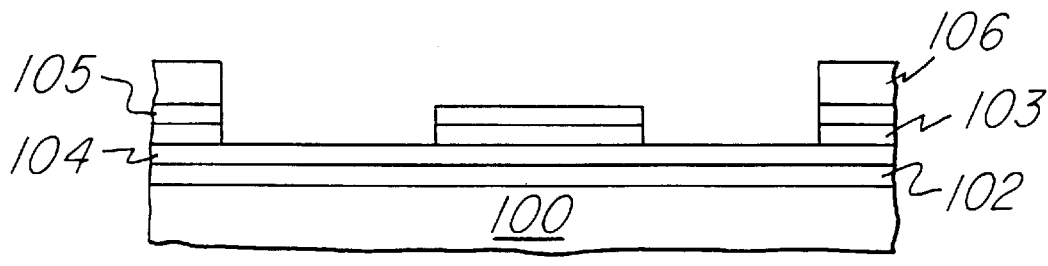
Figure 18D:
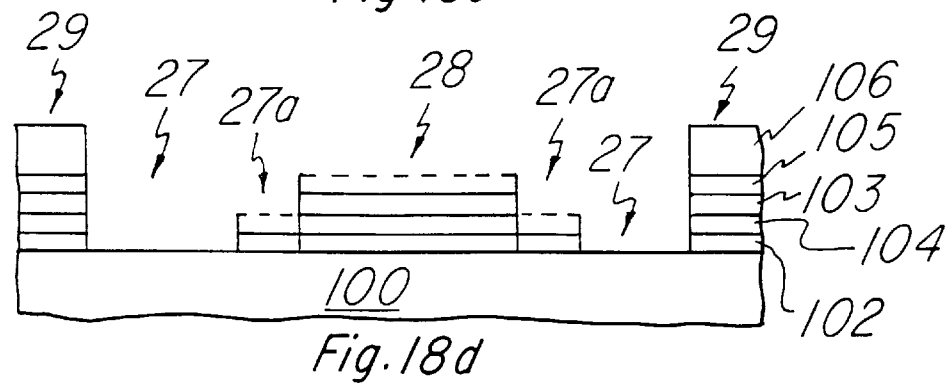

Referring now to FIG. 18b, a first mask layer (not shown) is formed over layer 106 and is patterned using standard photolithographic techniques. The thick layer 106 is then etched such that only the non-transmissive regions remain. The first mask (not shown) is then removed and a second mask layer (not shown) is formed. As shown in FIG. 18c, the covered by the second mask (no which were not covered by the second mask (not shown) are removed. Repeating the sequence, the second mask (not shown) is then removed and a third mask layer (not shown) is formed. As shown in FIG. 18d, the portions of layers 104 and 102 which were not covered by the third mask (not shown) are then removed. The final mask illustrated in FIG. 18d.

Bipolar-CDOS devices and processes are contemplated wherein BiCDOS provides further analogous integrated circuitry with the advantages described hereinabove. This technology can be derived from CMOS and NPN. However, bipolar action may be more difficult to achieve.

The structures and methods can be applicable to fabrication of capacitors, resistors, bipolar and field effect transistors, photodiodes, phototransistors, radiation sensors, capacitive sensors, humidity sensors and other types of sensors, light emitting diodes, thyristors, and all of the various passive and active devices to which their advantages commend them. The structures can be formed on an integrated circuit chip or on other layers such as printed wiring boards.

Thus, this proposed technology can literally provide a quartz substrate with many polyimide or other polymer or organic layers that are spun on and patterned. In addition, the structures described herein can be formed on a printed wiring board, for example to interconnect different chips. In other words, the present invention provides a method and structure for forming active devices on a printed circuit board.

The concepts of the present invention are also useful in LCD (liquid crystal diode) or display drivers where thin film transistors (TFTs) are needed. These devices are attractive because the structure is simple and the technology for spinning and patterning is relatively inexpensive. For example, in an LCD display where the pixel pitch is on the order of 280 microns, very gross lithography can be used to define the transistors.

In some examples, the insulating substrate (e.g., quartz or polyimide) provides properties somewhat analogous to an SOI (silicon on insulator) device. In SOI technology, the back gate is allowed to float in some designs, and this polyimide transistor can also advantageously have the back gate float. The advantage is that space is not needed for a contact. On the other hand, in the example where the substrate is conductive (e.g., doped silicon), the back gate, i.e., the substrate, can be biased to enhance device performance (or alternately can be allowed to float).

Normally, it is preferable to have no interfacial charge between the substrate 12 and the p– polyimide layer 14. Fortunately, there is evidence from the use of polyimide in existing technologies that this charge is not formed in laying down the p– polyimide layer. For example, a polyimide layer above the overcoat of a DRAM lacks any charge, which if it existed would affect the operation of the DRAM underneath. Controlled fixed charge is also acceptable, as is shown by current MOS technology.

Figure 19A:
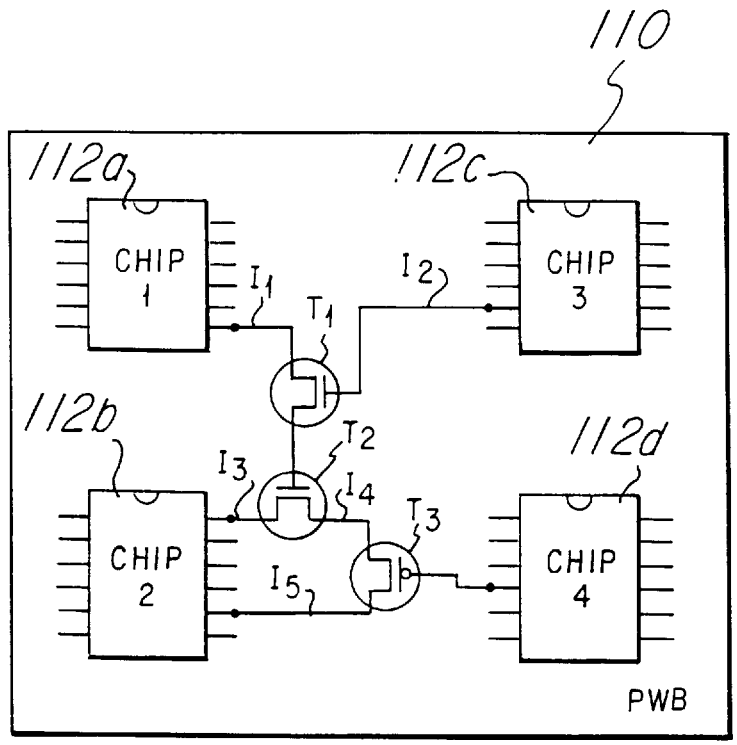
FIGS. 19a–19b illustrate an application of the present invention for use in printed circuit boards.

An application of the present invention is illustrated in FIG. 19. FIG. 19 illustrates a printed circuit board (or printed wiring board) 110. Active elements are formed directly on the circuit board 110. In the example illustrated in FIG. 19a, four chip packages 112 have been attached (e.g., soldered or epoxied) onto the circuit board 110. Also illustrated on the circuit board are three exemplary transistors $T_1$–$T_3$ as well as interconnect lines $I_1$–$I_5$. The transistors $T_1$–$T_3$ are connected in an arbitrary circuit to illustrate the concept. In reality, there would likely be a larger number of transistors, each much smaller than the chips and in fact smaller than the unaided eye could see.

Figure 19B:
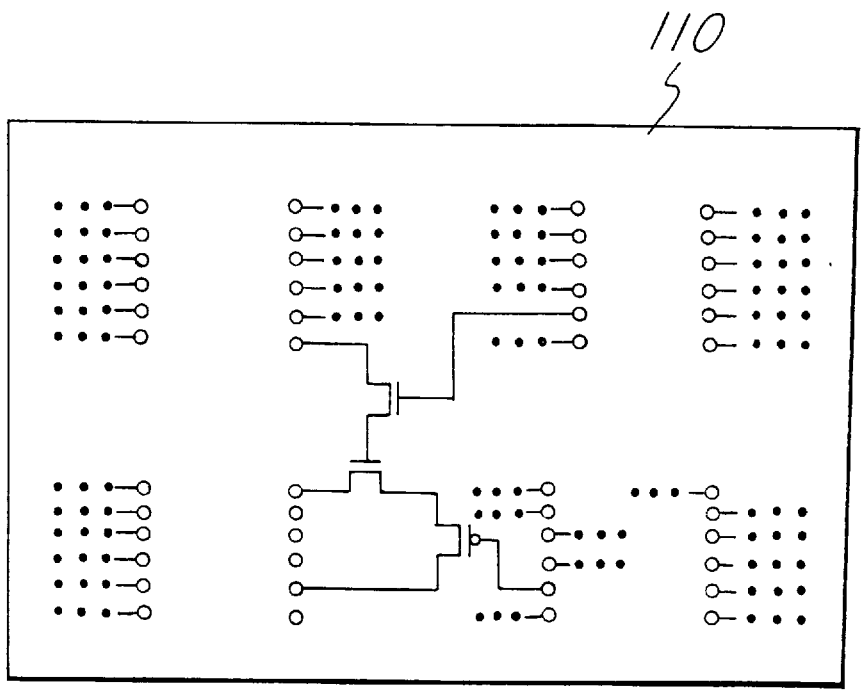

FIG. 19b illustrates the circuit board of 110 of FIG. 19a without the packaged chips 112. Active devices such as transistors (field effect and/or bipolar) and passive elements such as interconnects, resistors and capacitors may be formed on the circuit board. These devices can be formed as described herein and in copending application Ser. No. 07/590,259 (TI-15105).

The embodiment of FIG. 19 has several advantages. First, by including circuitry directly on the board, a number of chips may be eliminated. In one simple example, consider a microprocessor chip with several memory (e.g. DRAM) chips. In many applications, an additional address decoder chip is also used. Using the concepts of the present invention, the address decode circuitry can be formed directly on the board eliminating that chip. In the most extreme case, all the chips may be eliminated (although this would really be the same as the embodiments already described herein, for example with respect to FIGS. 1, 14, 15 and 16).

In addition, a trend for some semiconductor applications is to combine many functions on a single chip. For example, single chips can be built with some or all of microprocessors, memory (RAM and/or ROM), digital single processors, co-processors, analog-to-digital convertors, and non-volatile memories. By including some of the circuitry on the board, much greater flexibility can be obtained. For example, the peripheral circuitry which couples the components can be formed on the board. This way architectural changes can be made without redesigning the chip. This provides one example of the many possible wafer scale integration applications.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a transistor device comprising the steps of:
   providing a neutral layer of radiation sensitive polymer material over a first polarity doped layer of radiation sensitive polymer material;
   irradiating the device to form first and second source/drain regions of second polarity in the neutral layer and extending to a top portion of the doped layer; and
   irradiating the device to form a gate region in a top portion of the neutral layer between the first source/drain region and the second source/drain region to form a channel region in the doped layer beneath the gate region.

2. The method of claim 1 wherein the irradiating steps comprise irradiating the device with electromagnetic radiation.

3. The method of claim 2 wherein the radiation is selected from the group consisting of x-rays, gamma rays, ultraviolet radiation, visible light, and infrared radiation.

4. The method of claim 2 wherein the step of irradiating the device to form a gate region is performed using a mask between the device and a radiation source.

5. The method of claim 2 wherein the radiation is selected from the group consisting of x-rays, gamma rays, ultraviolet radiation, visible light, and infrared radiation.

6. The method of claim 2 wherein the steps of irradiating the device to form first and second source/drain regions is performed using a mask between the device and a radiation source.

7. The method of claim 1 wherein the steps of irradiating the device each comprise irradiating with photon radiation.

8. The method of claim 1 wherein the steps of irradiating the device comprise irradiating with particle radiation.

9. The method of claim 8 wherein the particle radiation is selected from the group consisting of electrons, ions and subatomic particles.

10. The method of claim 1 wherein the source/drain regions and the gate region are formed simultaneously by irradiating through a single mask.

11. The method of claim 10 wherein the single mask comprises a portion having a semitransmissive material through which the gate is irradiated, the semitransmissive material having a transmission coefficient of from about 0.1 to about 0.2.

12. The method of claim 1 wherein the irradiating steps are performed by irradiating the device with a direct write radiation beam.

13. The method of claim 12 wherein the direct write radiation beam varies in intensity between only two levels.

14. The method of claim 12 wherein the direct write radiation beam is scanned at a variable rate.

15. The method of claim 1 wherein the first polarity doped layer is deposited on a substrate and the neutral layer is deposited over the first polarity doped layer.

16. The method of claim 15 wherein the substrate is selected from the group consisting of silicon, quartz, gallium arsenide, glass, ceramic, metal, germanium, barium strontium titanate, mercury cadmium telluride, lithium niobate and polyimide.

17. The method of claim 1 wherein the step of providing a neutral layer over a doped layer comprises the step of doping a well region within an undoped layer of radiation sensitive polymer material.

18. The method of claim 1 wherein the radiation sensitive polymer material comprises a polyimide material.

19. The method of claim 1 wherein the radiation sensitive polymer material comprises polybenzimidazole.

20. A method of forming a field effect transistor, the method comprising the steps of:
   providing a radiation sensitive polymer material; and
   irradiating the polymer material with electromagnetic radiation to simultaneously form a first source/drain region, a second source/drain region and a gate region.

21. The method of claim 20 wherein the step of irradiating the polymer material is performed by irradiating through a single mask.

22. The method of claim 21 wherein the single mask comprises a portion having a semitransmissive material through which the gate is irradiated, the semitransmissive material having a transmission coefficient of from about 0.1 to about 0.2.

23. The method of claim 20 wherein the polymer material comprises a polyimide material.

24. A method of forming a transistor device comprising the steps of:
   depositing a polyimide layer on a substrate;
   doping the polyimide layer to form a doped polyimide layer;
   depositing an undoped polyimide layer on the doped polyimide layer;
   directing electromagnetic radiation toward the undoped polyimide layer to form first and second source/drain regions which extend to a top portion of the doped polyimide region; and
   directing electromagnetic radiation toward a top portion of the undoped polyimide to form a gate region between the first source/drain region and a second source/drain region to form a channel region in the doped layer beneath the gate region.

25. The method of claim 24 wherein the steps of forming a polyimide layer and doping the polyimide layer are performed simultaneously.

26. The method of claim 24 wherein the step of doping the polyimide layer comprises the step of forming a well region of a first conductivity type within an undoped polyimide layer.

27. The method of claim 26 and further comprising the step of forming a second well region within the undoped polyimide layer, the second well region having a conductivity type opposite that of the first well region.

28. The method of claim 24 wherein the source/drain regions and the gate region are formed simultaneously by irradiating through a single mask.

29. The method of claim 24 wherein the electromagnetic radiation comprises x-ray radiation.

30. The method of claim 24 wherein the electromagnetic radiation comprises ultraviolet radiation.

31. The method of claim 24 wherein the electromagnetic radiation comprises visible light.

32. The method of claim 24 wherein the electromagnetic radiation comprises infrared radiation.

* * * * *